United States Patent
Badalone (10) Patent No.: US 8,315,349 B2
(45) Date of Patent: Nov. 20, 2012

(54) BANG-BANG PHASE DETECTOR WITH SUB-RATE CLOCK

(75) Inventor: Riccardo Badalone, St.-Lazare (CA)

(73) Assignee: Diablo Technologies Inc., Ottawa (CA)

( * ) Notice: Subject to any disclaimer, the term of this patent is extended or adjusted under 35 U.S.C. 154(b) by 1029 days.

(21) Appl. No.: 12/258,440

(22) Filed: Oct. 26, 2008

(65) Prior Publication Data

US 2009/0110136 A1 Apr. 30, 2009

Related U.S. Application Data

(60) Provisional application No. 61/001,098, filed on Oct. 31, 2007.

(51) Int. Cl.
*H03D 3/24* (2006.01)

(52) U.S. Cl. ........ 375/376; 375/294; 375/327; 375/354; 375/371; 375/375

(58) Field of Classification Search .................. 375/293, 375/294, 316, 322, 327, 354, 360, 371, 373, 375/375, 376
See application file for complete search history.

(56) References Cited

U.S. PATENT DOCUMENTS

| | | | |
|---|---|---|---|
| 5,455,540 A | 10/1995 | Williams | |
| 5,592,125 A | 1/1997 | Williams | |
| 6,316,966 B1 | 11/2001 | Chang | |
| 6,433,595 B1 | 8/2002 | Tung | |
| 6,459,308 B1 | 10/2002 | Tung | |
| 6,526,109 B1 | 2/2003 | Chang | |
| 6,556,056 B1 | 4/2003 | Tung | |
| 6,683,920 B1 | 1/2004 | Coy | |
| 6,822,483 B1 | 11/2004 | Fu | |
| 7,053,719 B2 | 5/2006 | Steinbach | |
| 7,209,009 B2 | 4/2007 | Steinbach | |
| 7,433,442 B2 * | 10/2008 | Briones | 375/375 |
| 7,477,716 B2 * | 1/2009 | Mai | 375/376 |
| RE40,939 E * | 10/2009 | Huang | 375/376 |
| 7,826,583 B2 * | 11/2010 | Jeong et al. | 375/376 |
| 7,844,021 B2 * | 11/2010 | Gibbons et al. | 375/371 |
| 2003/0048117 A1 | 3/2003 | Tung | |
| 2004/0114702 A1 | 6/2004 | Friedman | |
| 2004/0141567 A1 * | 7/2004 | Yang et al. | 375/287 |
| 2004/0252804 A1 * | 12/2004 | Aoyama | 375/376 |
| 2006/0139108 A1 | 6/2006 | Steinbach | |
| 2007/0002993 A1 | 1/2007 | Wang | |
| 2007/0140399 A1 * | 6/2007 | Kossel et al. | 375/376 |
| 2007/0177703 A1 * | 8/2007 | Senba | 375/376 |
| 2008/0080649 A1 | 4/2008 | Gibbons | |
| 2010/0205488 A1 * | 8/2010 | Sanduleanu et al. | 714/700 |

* cited by examiner

*Primary Examiner* — Hirdepal Singh
(74) *Attorney, Agent, or Firm* — IP-MEX Inc.; Victoria Donnelly (57) ABSTRACT

The present invention describes methods and circuitry for a sub-rate bang-bang phase detector, in which the reference clock has frequency that is a fraction of the bit rate of the received data stream. The sub-rate bang-bang phase detector is enabled by multiple phases of the reference clock.

17 Claims, 11 Drawing Sheets

BANG-BANG PHASE DETECTOR WITH SUB-RATE CLOCK

RELATED APPLICATIONS

The present application claims priority from the U.S. provisional application to Badalone, Riccardo Ser. No. 61/001,098 filed on Oct. 31, 2007, which is incorporated herein by reference.

FIELD OF THE INVENTION

The present invention relates to clock and data recovery from serial data streams, phase locked loops (PLL), and specifically phase detectors for phase locked loops.

BACKGROUND OF THE INVENTION

Bang-bang phase detectors are commonly used as a part of a phase locked loop, in which a clock is derived from, and locked to, the transitions of a serial data signal.

Figure 1:
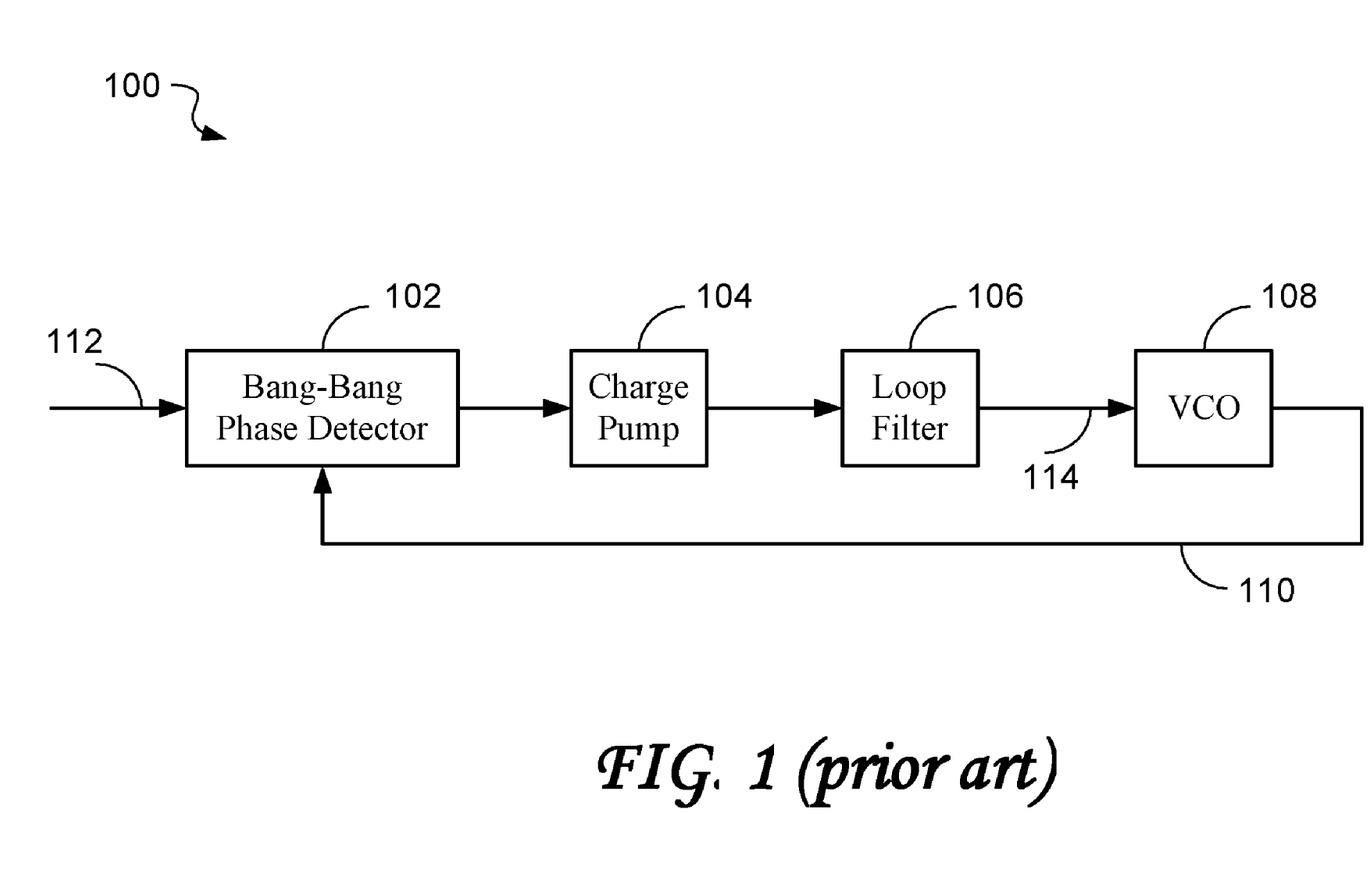
FIG. 1 illustrates a typical Phase locked Loop (PLL) 100 of the prior art including a bang-bang phase detector 102.

FIG. 1 illustrates a typical Phase locked Loop (PLL) 100 of the prior art, including a bang-bang phase detector 102, a charge pump 104, a loop filter 106, and a Voltage Controlled Oscillator (VCO) 108. The VCO 108 generates a clock signal 110 which is compared with a data signal 112 in the bang-bang phase detector 102. The output of the bang-bang phase detector 102 drives the charge pump 104 whose output is filtered through the loop filter 106. The filtered output is a voltage signal 114 that controls the frequency of the VCO 108.

Figure 2:
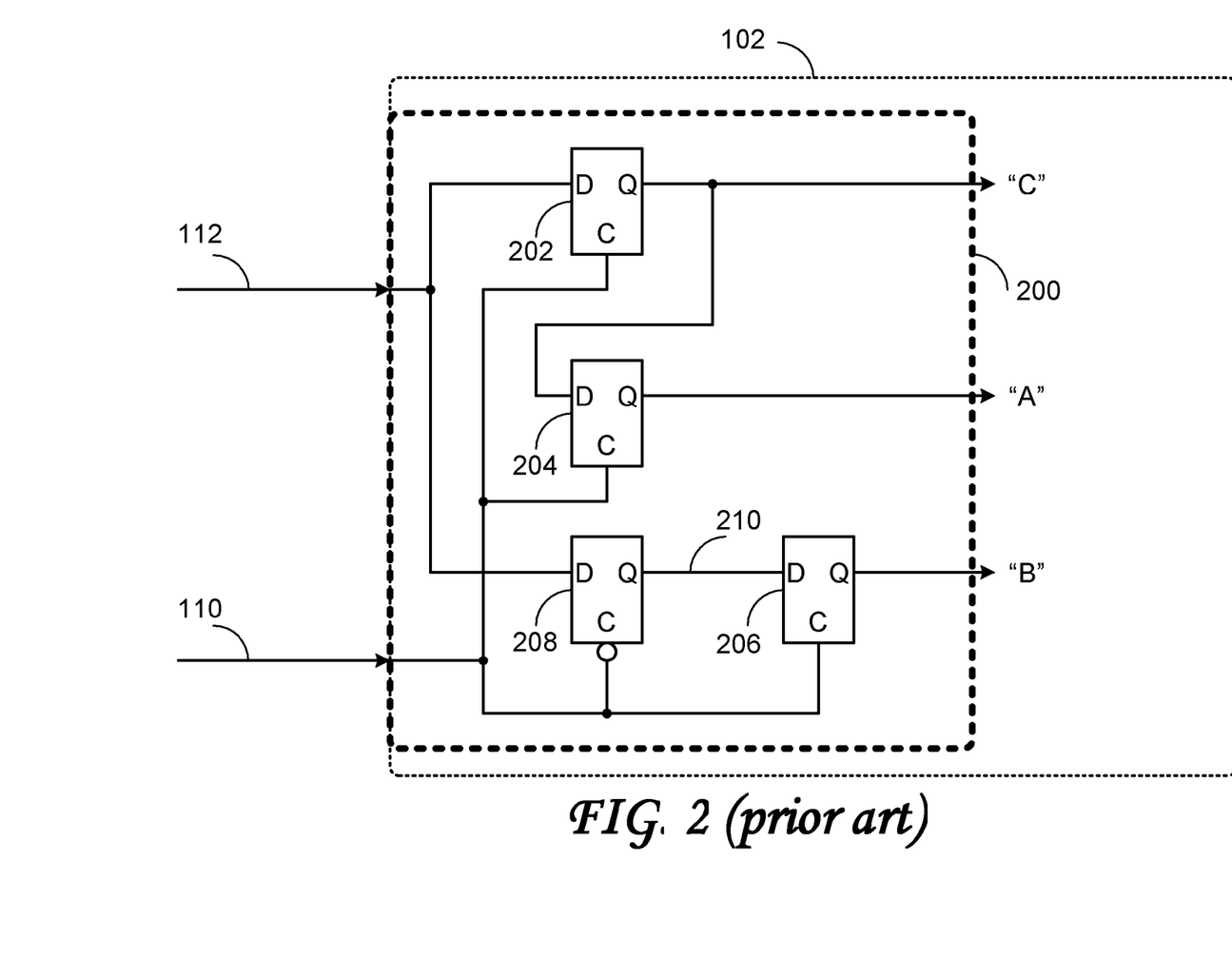
FIG. 2 shows a conventional implementation of a capturing part 200 of the bang-bang phase detector 102 of FIG. 1.

FIG. 2 shows a conventional implementation of a capturing part 200 of the bang-bang phase detector 102 to illustrate its operation. The capturing part 200 comprises three positive edge triggered flip-flops 202, 204, and 206, and a negative edge triggered flip-flop 208. The data signal 112 is input to the data inputs D of the first positive edge triggered flip-flop 202 and of the negative edge triggered flip-flop 208. The clock signal 110 is input to the clock inputs C of each of the flip flops 202 to 208. The data output Q of the first positive edge triggered flip-flop 202 is connected to the D input of the second positive edge triggered flip-flop 204. The data output Q of the negative edge triggered flip-flop 208 generates an edge-sampling signal 210 which is further connected to the D input of the third positive edge triggered flip-flop 206.

The Q outputs of each of the three positive edge triggered flip-flops 202, 204, and 206 generate delayed data output signals "C", "A", and "B" respectively which follow the data signal 112 as described next.

Figure 3:
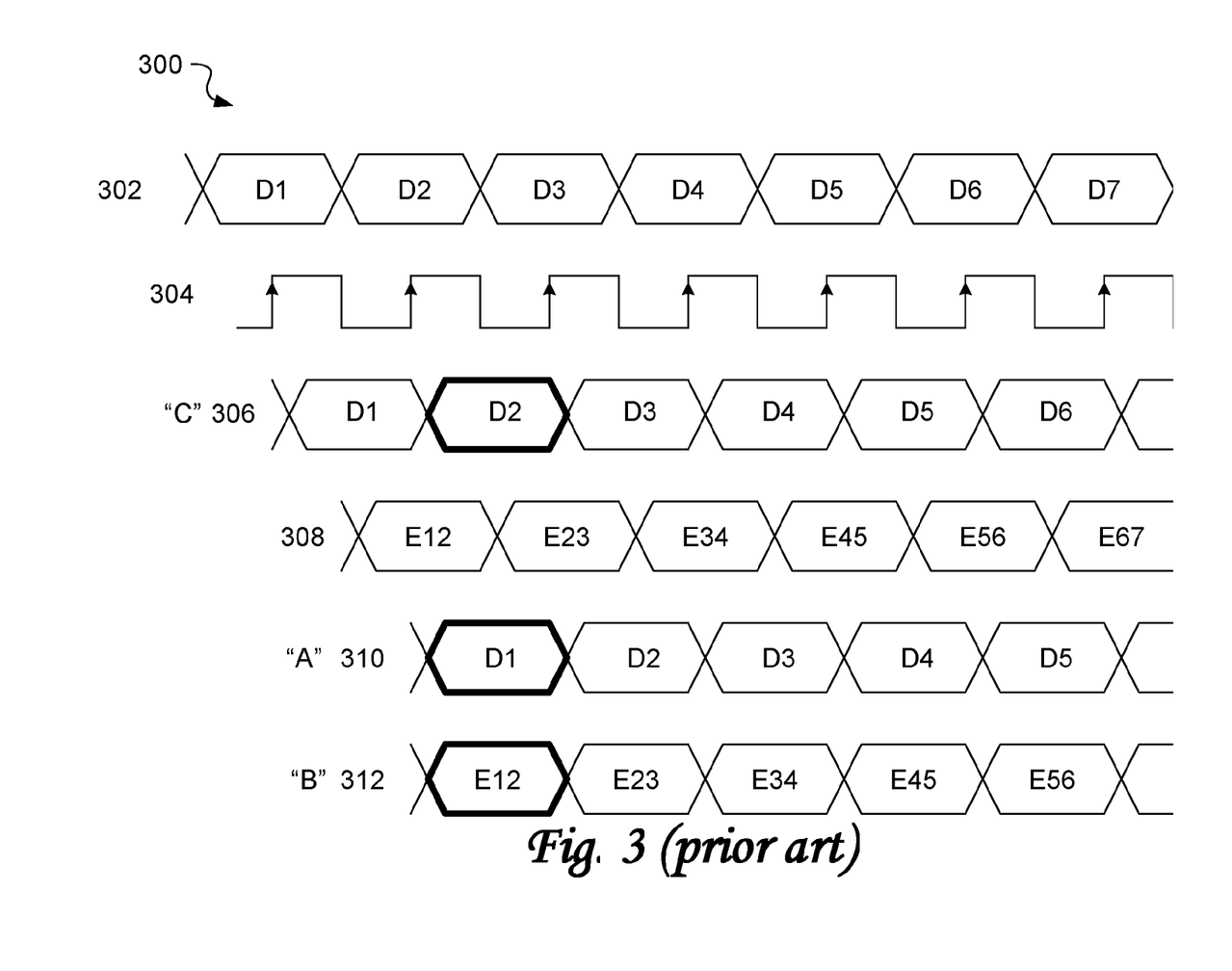
FIG. 3 is an exemplary timing diagram 300 to illustrate the capturing of data and data transitions of the capturing part 200 of FIG. 2.

FIG. 3 is an exemplary timing diagram 300 to illustrate the capturing of data and data transitions of the capturing part 200 of FIG. 2. The timing diagram 300 shows waveforms of:
 a serial data stream 302 which may be an instance of the data signal 112 of FIGS. 1 and 2;
 a full rate clock signal 304 which may be an instance of the clock signal 110 of FIGS. 1 and 2;
 a first delayed data stream 306 corresponding to the delayed output signal "C" of FIG. 2;
 a second delayed data stream 308 corresponding to the edge-sampling signal 210 of FIG. 2;
 a third delayed data stream 310 corresponding to the delayed output signal "A" of FIG. 2; and
 a fourth delayed data stream 312 corresponding to the delayed output signal "B" of FIG. 2.

Note that the delayed data streams 306, 310, and 312 are generated by positive edge triggered flip-flops while the delayed data stream 308 corresponding to the edge-sampling signal 210 is generated by the negative edge triggered flip-flop 208.

The serial data stream 302 is captured by the first positive edge triggered flip-flop 202 with the rising edge of the full rate clock signal 304 to generate the first delayed data stream 306 ("C"). This first delayed data stream 306 ("C") is delayed by a further clock period with the second positive edge triggered flip-flop 204 which generates the third delayed data stream 310 ("A"). The serial data stream 302 is also captured by the negative edge triggered flip-flop 208 with the falling edge of the full rate clock signal 304 to generate the second delayed data stream 308. This second delayed data stream 308 is then sampled by the next rising clock edge with the third positive edge triggered flip-flop 204 which generates the fourth delayed data stream 312 ("B").

In the timing diagram 300, it is assumed that the negative edges of the full rate clock signal 304 are synchronous with transitions of the serial data stream 302. The data values of the individual data bits of the serial data stream 302 are marked D1, D2, D3 etc. in the timing diagram 300. These data values are faithfully reproduced in delayed form in the first and third delayed data streams "A" and "C" respectively which are similarly marked D1, D2, D3 etc because the data bits are sampled in the center of their bit period where the data bit is stable.

Conversely, the values of the data bits of the second delayed data stream 308 are the results of sampling the serial data stream 302 at the time of the data transitions. Due to unavoidable signal jitter, sampling the data stream during a transition may result in capturing the value of the data bit just prior to the transition, or the value of the data bit following the transition. This uncertainty is indicated by the markings of the bits in the second delayed data stream 308 with E12, E23, E34 etc.

The fourth delayed data stream 312 ("B") is the result of retiming the second delayed data stream 308 with the rising edge of the full rate clock signal 304, thus becoming clock aligned with the data streams "C" and "A" in accordance with the practice of typical bang-bang phase detector designs.

To summarize, the delayed data output signals "A", "B", and "C" are clock synchronous digital signals that represent the state of the input data signal (the serial data stream 302) before, at, and after each positive edge of the full rate clock signal 304 when the clock is in synchronism and phase alignment with the edges of the input data signal.

FIG. 4 shows how the clock frequency is adjusted in the PLL 100 by the conventional bang-bang phase detector 102 depending on the situation with data transitions.

The set of diagrams of FIGS. 4a to 4f illustrates six examples of the delayed output signals "A", "B", and "C" depending on the alignment between the full rate clock signal 304 and the data transitions. In each of the FIGS. 4a to 4f a fragment of the data signal wave form corresponding to the serial data stream 302 is shown. The data signal wave form is indicated by a solid line which may assume low and high values ("lo" and "hi"), as well as a transition between these values. Further shown in each of the FIGS. 4a to 4f is a time fragment of the full rate clock signal 304 signal "CK" with which the data signal wave form is sampled over the span of one bit period. As described in FIG. 3, sampling of the data signal wave form with the positive edges of the clock results in values of "0" and "1" of the delayed output signals "A", and "C", while sampling with the negative edge results in the delayed output signal "B". The values of "A", "B", and "C" depend on the alignment between the clock and the transitions in the data signal wave form. These values in the vicinity of a possible transition of the data signal wave form may then be evaluated and used to determine if the frequency of the full rate clock signal 304 (the clock frequency) should be maintained, increased, or decreased.

Figure 4A:
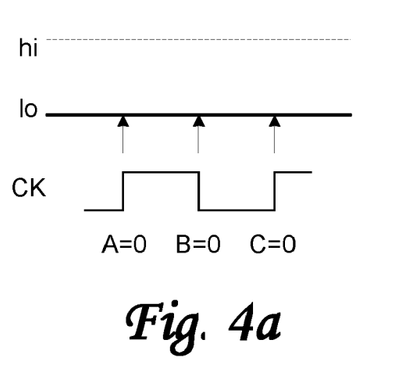

In FIG. 4a, the value of the data signal wave form is "lo", there is no transition, resulting in "A"=0, "B"=0, and "C"=0. No adjustment of the clock frequency is made.

Figure 4B:
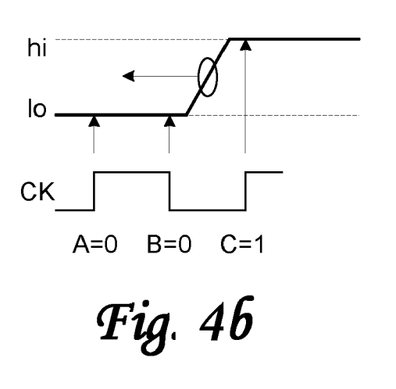

In FIG. 4b, there is a positive transition of the data signal wave form from "lo" to "hi", the transition occurring after the negative clock edge resulting in "A"=0, "B"=0, and "C"=1. The clock frequency should be increased in order to pull the data transition towards alignment with the negative clock edge as indicated by the arrow dragging the transition to the left.

Figure 4C:
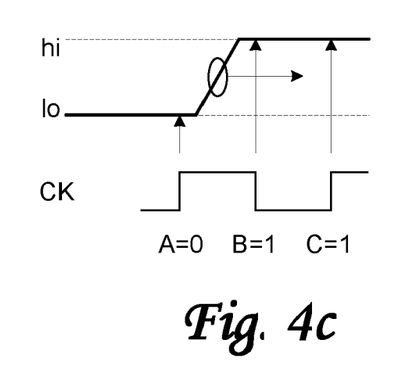

In FIG. 4c, there is a positive transition of the data signal wave form from "lo" to "hi", the transition occurring before the negative clock edge resulting in "A"=0, "B"=1, and "C"=1. The clock frequency should be decreased in order to pull the data transition towards alignment with the negative clock edge as indicated by the arrow dragging the transition to the right.

Figure 4D:
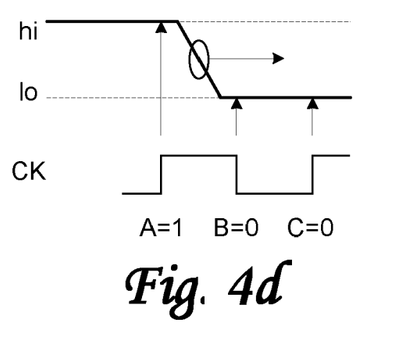

In FIG. 4d, there is a negative transition of the data signal wave form from "hi" to "lo", the transition occurring before the negative clock edge resulting in "A"=1, "B"=0, and "C"=0. The clock frequency should be decreased in order to pull the data transition towards alignment with the negative clock edge as indicated by the arrow dragging the transition to the right.

Figure 4E:
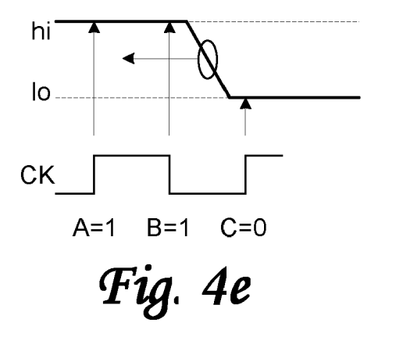

In FIG. 4e, there is a negative transition of the data signal wave form from "hi" to "lo", the transition occurring after the negative clock edge resulting in "A"=1, "B"=1, and "C"=0. The clock frequency should be decreased in order to pull the data transition towards alignment with the negative clock edge as indicated by the arrow dragging the transition to the left.

Figure 4F:
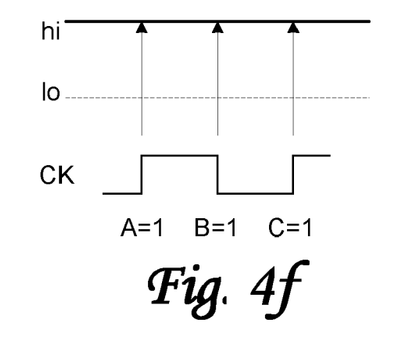

Lastly in FIG. 4f, the value of the data signal wave form is "hi", there is no transition, resulting in "A"=1, "B"=1, and "C"=1. No adjustment of the clock frequency is made.

No diagram is presented to show the negative clock edge coinciding with a transition of the data signal wave form. In this event, the negative edge triggered flip-flop 208 would resolve this into "0" or "1" with a statistically equal probability of 50%. This case arises when the correct clock frequency has been achieved by the PLL. As a result, the clock frequency adjustment will continue to be either to increase or to decrease with equal probability causing some clock jitter. The loop filter 106 (see FIG. 1) is commonly used to dampen this jitter.

Numerous improvements to the basic bang-bang phase detector design have been proposed in the prior art. For example, a modified bang-bang phase detector is described in U.S. Pat. No. 5,592,125 issued to Bertrand Williams which was designed to provide an improvement in terms of the resulting transfer function and jitter performance of a PLL based on the modified bang-bang phase detector.

In the United States Patent Application 2006/0139108 of Gunter Willy Steinbach et al. a more complex PLL incorporating a bang-bang phase detector is described which was designed to be less susceptible to overshoot and charge pump leakage.

PLLs based on a bang-bang phase detector of the prior art require a VCO having a frequency to match the data rate. In receivers for very high data rates it is often inconvenient to provide such a full rate clock.

In the United States Patent Application 2004/0114702 of Daniel J. Friedman, a half-rate bang-bang phase detector is described. However, this detector is based on a tri-state design realized with a special double-edge flip-flop that can trigger on both edges of the clock signal.

While the simplicity of the bang-bang principle would make a bang-bang phase detector an advantageous choice in a PLL for a high speed data receiver, this advantage is very much diminished by the need for a corresponding high speed clock which requires significant effort, for example in terms of power.

Accordingly, there is a requirement to develop a simple bang-bang phase detector, which could be implemented with ordinary high speed logic and operated with a reference clock of a reduced frequency.

SUMMARY OF THE INVENTION

Therefore there is an object of the present invention to provide an improved bang-bang phase detector with sub-rate clock and a PLL using the same.

According to one aspect of the invention, there is provided a phase detector for generating logic signals indicative of phase transitions of an input data stream with respect to a reference clock signal, the phase detector comprising:
  a first bit-storage device for sampling the input data stream with the reference clock signal;
  a second bit-storage device for sampling the input data stream with a first phase shifted clock signal whose phase is delayed by X degrees relative to the reference clock signal;
  a third bit-storage device for sampling the input data stream with a second phase shifted clock signal whose phase is delayed by Y degrees relative to the reference clock signal, to generate a logic signal "C"; and
  forth and fifth bit-storage devices for sampling outputs of the first and second bit-storage devices respectively to generate logic signals "A" and "B" respectively.

In the phase detector described above:
  the first bit-storage device is a first edge triggered bit-storage device responsive to one of a rising or falling edge of the reference clock signal;
  the second bit-storage device is a second edge triggered bit-storage device responsive to a respective rising or falling edge of the first phase shifted clock signal;
  the third bit-storage device is a third edge triggered bit-storage device responsive to a respective rising or falling edge of the second phase shifted clock signal; and
  the fourth and fifth edge triggered bit-storage devices are fourth and fifth edge triggered bit-storage devices, each responsive to the respective rising or falling edge of the reference clock signal.

The third edge triggered bit-storage device is responsive to a respective falling or rising edge of the reference clock signal instead of the second phase shifted clock signal.

In the embodiment of the invention, the first, second, third, fourth and fifth edge triggered bit-storage devices comprise respective edge triggered flip-flops.

In another embodiment of the invention, the first, second, and third bit-storage devices respectively comprise first, second, and third combinations of first and second transparent latches, wherein an output of the first transparent latch is coupled to an input of the second transparent latch in each of the respective combinations.

Conveniently, the first transparent latch is a high or low latching transparent latch, and the second transparent latch is a respective low or high latching transparent latch. Similarly, the forth and fifth bit-storage devices comprise respective high or low latching transparent latches.

Preferably, the phase of the first phase shifted clock signal is delayed by X=90 degrees relative to the reference clock signal, and the phase of the second phase shifted clock signal is delayed by Y=180 degrees relative to the reference clock signal.

Alternatively, the phase of the first phase shifted clock and the second phase shifted clock may be respectively delayed by X=180/N degrees and Y=360/N degrees relative to the reference clock signal, where N is a sub-rate factor by which a frequency of the reference clock is lower than a bit rate of the input data stream.

A phase locked loop (PLL), comprising the phase detector described above is also provided, the PLL further comprising a multiphase voltage controlled oscillator (VCO) for generating the reference clock signal and the first and second phase shifted clock signals.

Beneficially, the PLL further includes a logic circuit for deriving frequency adjustment signals from the logic signals "A", "B", and "C" for adjusting a frequency of the reference clock.

According to another aspect of the invention, there is provided a method of generating logic signals indicative of phase transitions of an input data stream with respect to a reference clock signal, the method comprising:

sampling the input data stream with a reference clock signal, including storing results of the sampling in a first bit-storage device;

sampling the input data stream with a first phase shifted clock signal whose phase is delayed by X degrees relative to the reference clock signal, including storing results of the sampling in a second bit-storage device;

sampling the input data stream with a second phase shifted clock signal whose phase is delayed by Y degrees relative to the reference clock signal to generate the logic signal "C", including storing results of the sampling in a third bit-storage device; and sampling outputs of the first and second bit-storage devices respectively to generate respective logic signals "A" and "B", including storing results of the sampling in forth and fifth bit-storage devices.

In the method described above:

sampling and storing in the first bit-storage device comprises sampling with a rising or falling edge of the reference clock signal;

sampling and storing in the second bit-storage device comprises sampling with a respective rising or falling edge of the first phase shifted clock signal;

sampling and storing in the third bit-storage device comprises sampling with a respective rising or falling edge of the second phase shifted clock signal; and sampling and storing in the fourth and fifth bit-storage devices comprises sampling with a respective rising or falling edge of the reference clock signal.

The sampling and storing in the third bit-storage device comprises sampling with a respective falling or rising edge of the reference clock signal instead of the second phase shifted clock signal.

In one embodiment of the invention, sampling and storing in the first bit-storage device includes latching in a first transparent latch and storing an output of the first transparent latch in a second transparent latch.

Conveniently, latching with the first transparent latch includes latching with a rising or falling edge of the reference clock signal, and storing in the second transparent latch includes latching with a respective opposite edge of the reference clock signal. Similarly, sampling and storing in the fourth and fifth bit-storage devices comprises latching in respective transparent latches.

Preferably, in the method described above, the phase of the first phase shifted clock signal is delayed by X=90 degrees relative to the reference clock signal, and the phase of the second phase shifted clock signal is delayed by Y=180 degrees relative to the reference clock signal.

As required, the phase of the first phase shifted clock and the second phase shifted clock may be respectively delayed by X=180/N degrees and Y=360/N degrees relative to the reference clock signal, where N is a sub-rate factor by which a frequency of the reference clock is lower than a bit rate of the input data stream.

A method of generating a reference clock signal in a phase locked loop (PLL) is also provided, comprising:

generating logic signals "A", "B" and "C" as described above;

generating the reference clock signal and the first and second phase shifted clock signals in a multiphase voltage controlled oscillator (VCO); and deriving frequency adjustment signals from the logic signals "A", "B", and "C" for adjusting a frequency of the reference clock.

Thus, an improved bang-bang phase detector with sub-rate clock, a PLL using the same, a method of generating logic signals indicative of phase transitions of an input data stream with respect to a reference clock signal, and a method of generating a reference clock signal in a phase locked loop (PLL) have been provided.

BRIEF DESCRIPTION OF THE DRAWINGS

An embodiment of the invention will now be described, by way of example, with reference to the accompanying drawings in which:

FIG. 4 including FIGS. 4a to 4f, show how the clock frequency is adjusted in the PLL 100 of FIG. 1 by the conventional bang-bang phase detector 102 depending on the situation with data transitions;

DETAILED DESCRIPTION OF THE EMBODIMENTS OF THE INVENTION

The embodiments of the present invention are concerned with a method and apparatus for implementing a bang-bang phase detector, which operates with a serial data stream and a reference clock of a reduced frequency. The reference clock frequency is reduced by at least a factor of two compared to the full rate.

Figure 5:
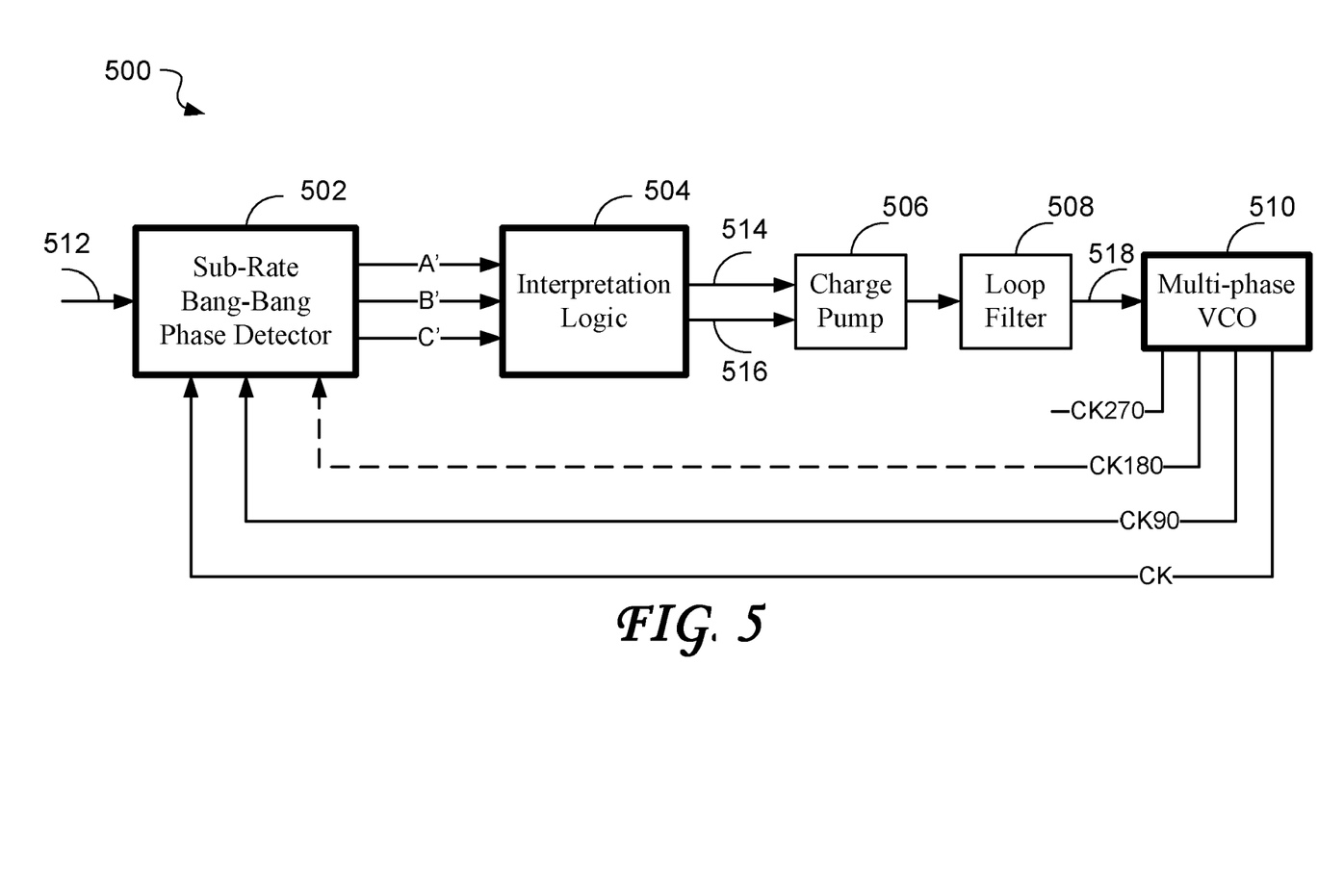
FIG. 5 shows an example phase lock loop (PLL) 500 that includes a sub-rate bang-bang phase detector 502 according to an embodiment of the invention.

FIG. 5 shows an example phase locked loop (PLL) 500 that includes a sub-rate bang-bang phase detector 502 according to an embodiment of the invention. The PLL 500 further includes an Interpretation Logic 504, a Charge Pump 506, a Loop Filter 508, and a Multi-Phase VCO 510.

The sub-rate bang-bang phase detector 502 receives an input data stream 512 and two clock signals, a reference clock (CK), and a 90° phase-shifted clock (CK90). Depending on the implementation of the bang-bang phase detector 502, a 180° phase-shifted clock (CK180) may also be used. The clock signals are generated by the Multi-Phase VCO 510. The sub-rate bang-bang phase detector 502 generates three logic signals A', B', and C'. These logic signals of the sub-rate bang-bang phase detector 502 are analogous to the similar delayed output signals "A", "B", and "C" of the bang-bang phase detector 102 of the prior art (FIG. 2) in that they represent three consecutive samples of the wave form of the input data stream 512, but differ significantly in the way they are generated.

The three logic signals A', B', and C' output from the sub-rate bang-bang phase detector 502, are input to the Interpretation Logic 504 which generates from these inputs two charge pump control signals, an "adjust up" signal 514 and an "adjust down" signal 516. The charge pump control signals 514 and 516 are input to the Charge Pump 506 whose output is passed through the Loop Filter 508 to provide a frequency control signal 518 that is input to the Multi-Phase VCO 510.

The Charge Pump 506 and the Loop Filter 508 may be designed according to conventional practice.

The Multi-Phase VCO 510 generates the reference clock CK and the 90° phase-shifted clock CK90 that are coupled to the sub-rate bang-bang phase detector 502. In the example PLL 500, the frequency generated by the Multi-Phase VCO 510, i.e. the frequency of the reference clock CK is one half the data rate. For example if the data rate of the input data stream 512 is 10 Gbit/s then the frequency generated by the Multi-Phase VCO 510 is 5 GHz.

Figure 6:
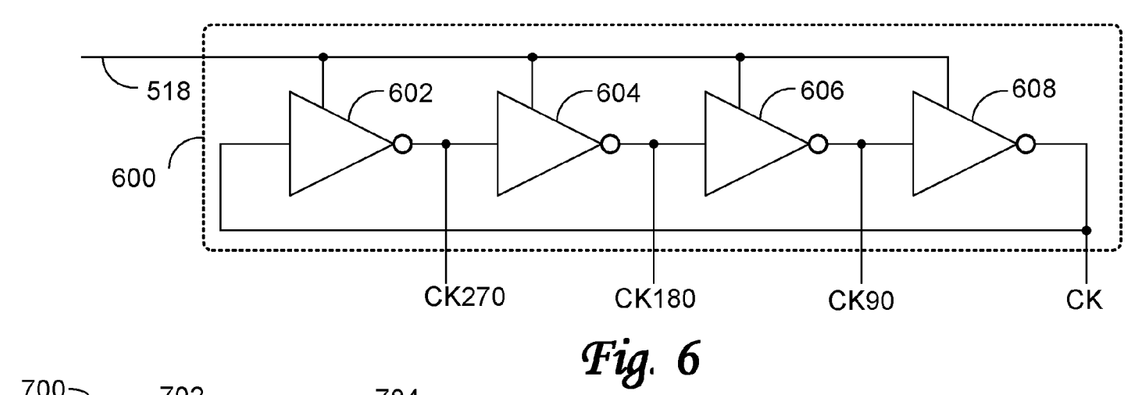
FIG. 6 shows a simplified block diagram 600 of the multiphase VCO 510 of the PLL 500 of FIG. 5.

The Multi-Phase VCO 510 may be implemented in the form of a ring oscillator as shown in FIG. 6 below in which four phase-shifted outputs are naturally generated, i.e. the reference clock CK, the 90° phase-shifted clock CK90, as well as a 180° phase-shifted clock (CK180) and a 270° phase-shifted clock (CK270). Other methods of generating a VCO with phase-shifted outputs are also well known, for example with a delay line or a tapped delay line.

The sub-rate bang-bang phase detector 502 and the Interpretation Logic 504 are described in detail with regard to FIGS. 8 to 11 below.

FIG. 6 shows a simplified block diagram 600 of the multi-phase VCO 510 of the PLL 500, implemented in the form of a conventional ring oscillator, including four inverter stages 602, 604, 606, and 608 connected in a ring, and with their power supply terminals connected to the frequency control signal 518. The inverter stages 602, 604, 606, and 608 generate respectively the phase shifted clocks CK270, CK180, CK90, and the reference clock CK. As is well known, the ring oscillator oscillates at a frequency that is determined by the circuit delays of the inverter stages which may in turn be controlled over a certain range by varying the power supply voltage. The frequency control signal 518, connected to the power supply terminals, may thus be used to control the frequency of the multi-phase VCO 510. An improved VCO has been described in the co-pending U.S. patent application to Pfaff, Dirk, Ser. No. 11/984,852, filed on Nov. 23, 2007 entitled "Voltage Controlled oscillator (VCO) with a Wide Tuning Range and Substantially Constant Voltage Swing over the Tuning Range", which is incorporated herein by reference.

Figure 7:
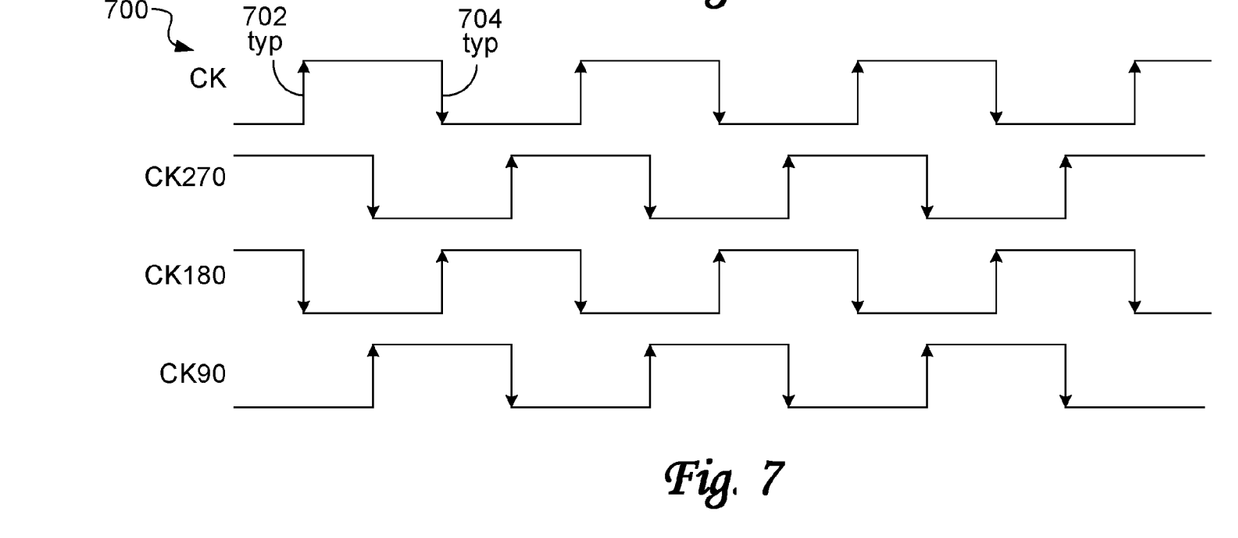
FIG. 7 shows a timing diagram 700, illustrating the wave forms of the reference clock CK and the phase shifted clocks CK270, CK180, CK90 of the multiphase VCO 510 of FIG. 6.

FIG. 7 shows a timing diagram 700, illustrating the wave forms of the reference clock CK and the phase shifted clocks CK270, CK180, CK90 of the multi-phase VCO 510 of FIG. 6. Each wave form is ideally a square wave with rising edges and falling edges (702 and 704 respectively).

Figure 8A:
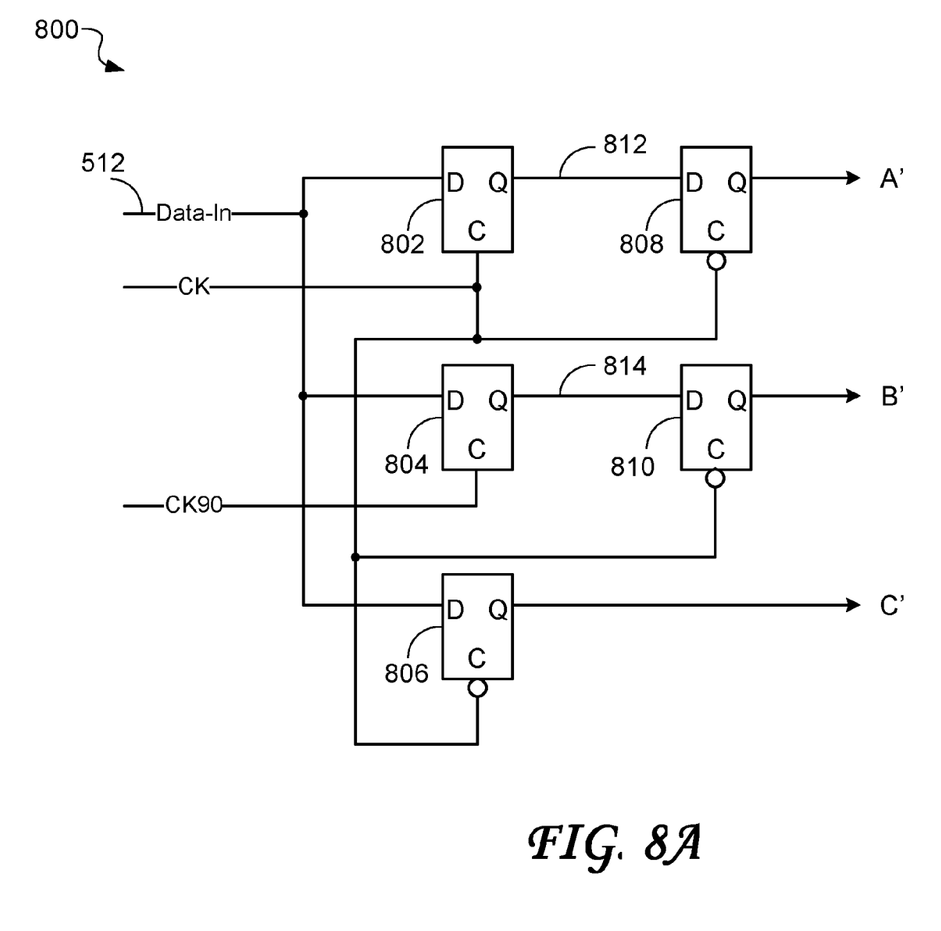
FIG. 8A shows a block diagram of a first implementation 800 of the sub-rate bang-bang phase detector 502 of FIG. 5.

FIG. 8A shows a block diagram of a first implementation 800 of the sub-rate bang-bang phase detector 502 of FIG. 5, comprising two positive edge triggered flip-flops 802, and 804, and three negative edge triggered flip-flops 806, 808, and 810. The edge triggered flip-flops 802 to 810 may be realized as conventional D-type flip-flops having a clock input C, a data input D and an output Q. A D-type flip-flop is an edge triggered bit-storage device which captures the logic value of the signal applied to the data input D to set the output Q following the (positive or negative) edge triggering action of the signal applied to the clock input C.

The input data stream 512 (Data-In) is input to the data inputs D of the first positive edge triggered flip-flop 802 and of the first negative edge triggered flip-flop 806. The phase shifted clock CK90 is input to the clock input C of the second positive edge triggered flip flop 804. The reference clock CK is input to the clock inputs C of the first positive edge triggered flip flop 802, and of all negative edge triggered flip-flops 806 to 810. The data output Q of the first positive edge triggered flip-flop 802 is a node 812 carrying a first intermediate signal that is connected to the D input of the second negative edge triggered flip-flop 808. Similarly, the data output Q of the second positive edge triggered flip-flop 804 is a node 814 carrying a second intermediate signal that is connected to the D input of the third negative edge triggered flip-flop 810.

The Q outputs of each of the three negative edge triggered flip-flops 806, 808, and 810 generate the logic signals C', A', and B' respectively.

Figure 8B:
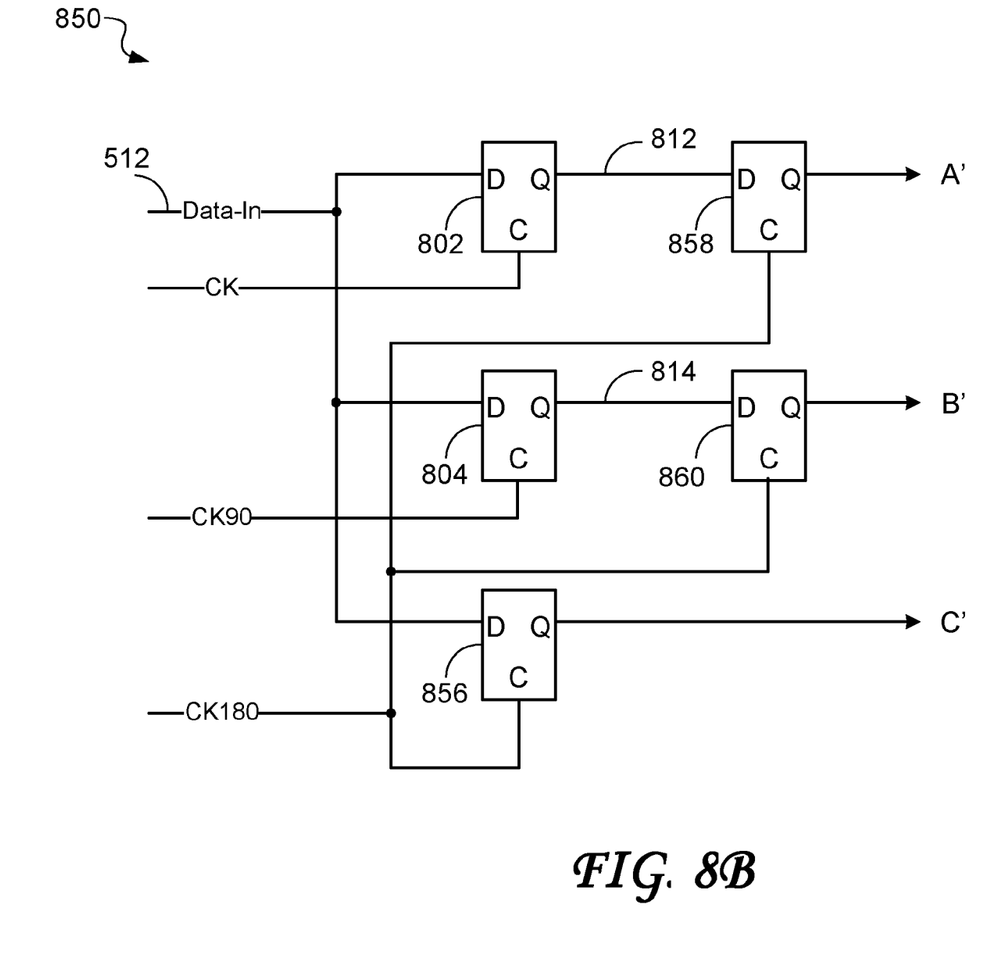
FIG. 8B shows a block diagram of an alternate clocking arrangement 850 of the first implementation 800 of FIG. 8A.

FIG. 8B shows a block diagram of an alternate arrangement 850 of the first implementation 800 of FIG. 8A. In the first implementation 800, the three negative edge triggered flip-flops 806, 808, and 810 are triggered with the falling edge of the reference clock CK which is assumed to have a 50% duty cycle. In the alternative arrangement 850, positive edge triggered flip-flops 856, 858, and 860 are used in place of the three negative edge triggered flip-flops 806, 808, and 810. The clock inputs of the positive edge triggered flip-flops 856, 858, and 860 are coupled to the 180° phase-shifted clock CK180 available from the multi-phase VCO 510 (see FIGS. 5 and 6). The alternative clocking arrangement has no effect on the data signals bearing the same reference labels in both FIGS. 8A and 8B. The first implementation 800 may be preferred over the alternate arrangement 850, because only two clock signals instead of three need to be distributed from the multi-phase VCO 510 to the Sub-Rate Bang-Bang Phase Detector 502.

While the alternate arrangement 850 is functionally equivalent to the first implementation 800 when the sub-rate factor N is two, the alternative arrangement 850 may be used directly in cases where a higher sub-rate factor N is desired, by changing the reference clock and the phase shifted clocks as described below.

Figure 9:
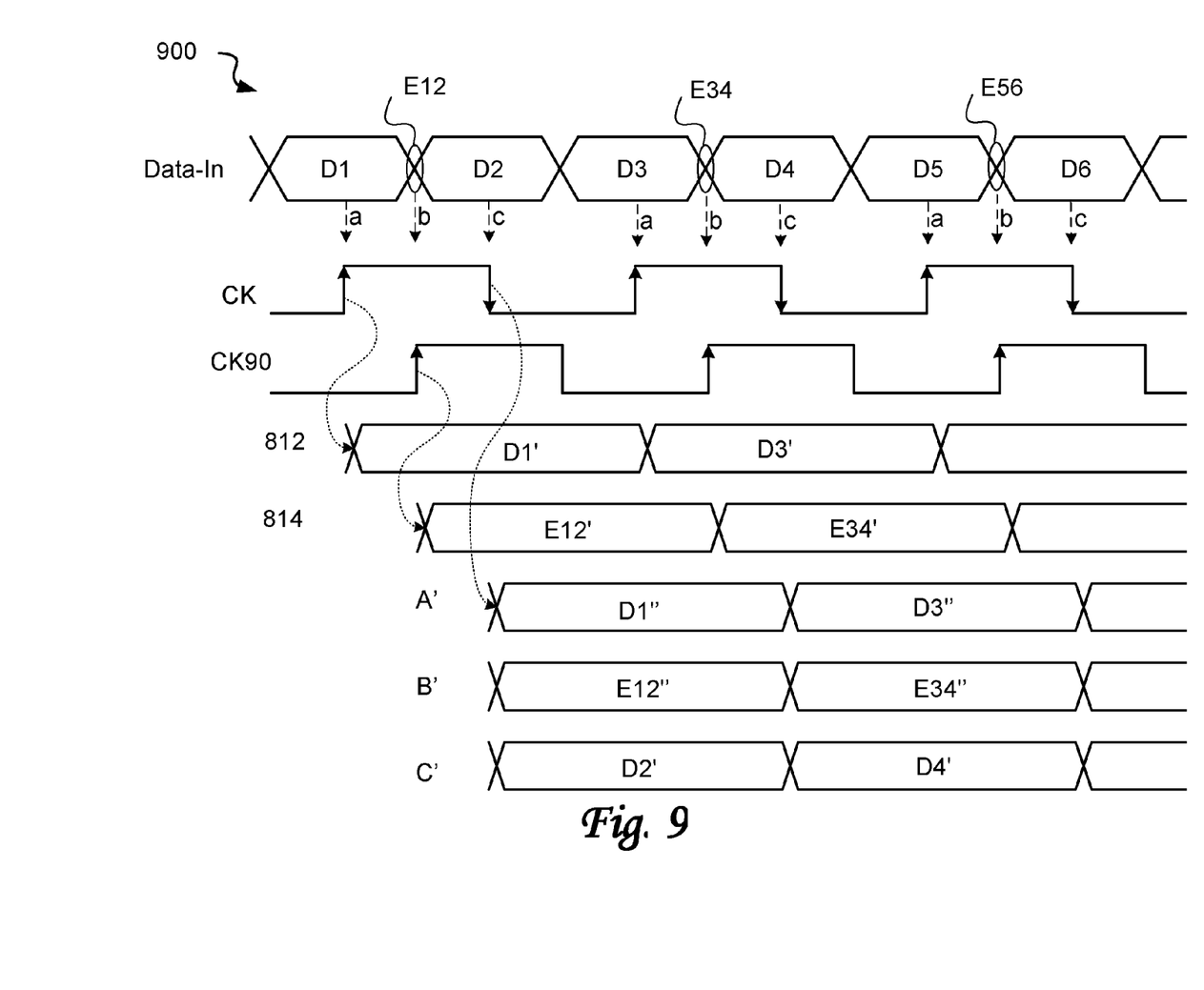
FIG. 9 is a timing diagram 900 illustrating the operation of the first implementation 800 of FIG. 8A of the sub-rate bang-bang phase detector 502 of FIG. 5.

FIG. 9 is a timing diagram 900 illustrating the operation of the first implementation 800 of FIG. 8A of the sub-rate bang-bang phase detector 502 of FIG. 5.

The timing diagram 900 illustrates waveforms of:

the received input data stream 512 (Data-In) comprising a sequence of data bits D1, D2, D3, . . . , as well as data transitions E12 between D1 and D2, and E34 between D3 and D4;

the reference clock CK with rising and falling clock edges indicated;

the phase-shifted clock CK90 with the rising clock edge indicated;

the first intermediate signal at the node 812 (FIG. 8) comprising a sequence of data values D1', D3', . . . , which are clocked samples of the odd-numbered data bits of Data-In;

the second intermediate signal at the node 814 (FIG. 8) comprising a sequence of data values E12', E34', . . . , which are clocked samples of the transitions between consecutive odd and even-numbered data bits of Data-In, i.e. digitally resolved values of E12, E34, . . . ;

the logic signal A' which is a sequence of data values D1", D3", . . . , that are re-clocked versions of the data values D1', D3' of the first intermediate signal;

the logic signal B' which is a sequence of data values E12", E34", . . . , that are re-clocked versions of the data values E12', E34' of the second intermediate signal;

the logic signal C' which is a sequence of data values D2', D4', . . . , which are clocked samples of the even-numbered data bits of Data-In.

Sampling points "a", "b", and "c" marking the waveform of the input data stream Data-In, indicate respectively where Data-In is sampled by: the rising edge of the reference clock CK; the rising edge of the phase-shifted clock CK90; and the falling edge of the reference clock CK. The data values of the logic signals A', B', and C' represent the values of the input data stream at corresponding sampling points "a", "b", and "c".

The received input data stream 512 (Data-In) comprising a sequence of data bits D1, D2, D3, . . . , is captured by the first positive edge triggered flip-flop 802 on the rising edges of the reference clock CK. The output of the first positive edge triggered flip-flop 802 (node 812) produces the first intermediate signal of data values sampled from Data-In at the sampling points "a", i.e. the data bits D1, D3, . . . are sampled to produce data bits D1', D3', . . . of the stream 902.

The received input data stream 512 (Data-In) is also captured by the first negative edge triggered flip-flop 806 on the falling edges of the reference clock CK, producing the data bits of the logic signal C', that is D2', D3', . . . which is a stream of data values sampled from Data-In at the sampling points "c".

The received input data stream 512 (Data-In) is also captured by the second positive edge triggered flip-flop 804 on the rising edges of the phase shifted clock CK90. The output of the second positive edge triggered flip-flop 804 (node 814) produces the second intermediate signal of data values sampled from Data-In at the sampling points "b", i.e. the data bit transitions D1 to D2, D3 to D4, . . . are sampled to produce data bits E12', E34', . . . of the stream 904.

The first and second intermediate signals (at the nodes 812 and 814) and the stream of the logic signal C', corresponding to samples of the input data stream, sampled at points "a", "b", and "c" must be aligned with each other for subsequent processing according to the bang-bang principle. The second and third negative edge triggered flip-flops 808 and 810 serve this purpose.

To this end, the second negative edge triggered flip-flop 808 captures the first intermediate signal (node 812, FIG. 8) to generate the logic signal A' which is a sequence of data values D1", D3", . . . , aligned on the same (falling) clock edges as the logic signal C'. Similarly, the third negative edge triggered flip-flop 810 captures the second intermediate signal (node 814, FIG. 8) to generate the logic signal B' which is a sequence of the data values E12", E34", also aligned on the same (falling) clock edges as the logic signal C'.

Thus, the logic signals A', B', and C', are all aligned with the falling edges of the reference clock CK.

Note that the reference clock CK and the phase-shifted clock CK90 are sub-rate clocks, running at one half of the data rate. As a result, the logic signals A', B', and C' also run at half the rate of the input data stream. Only every second transition is captured (B'), along with the data bits before (A') and following (C') each sampled transition. Thus, the sub-rate bang-bang phase detector 502 captures data values two-times less often than the conventional bang-bang phase detector 102 (see FIGS. 2 and 3). As a consequence, frequency adjustment is performed less often. However this reduction in the adjustment frequency for the reference clock is still within an acceptable range, and may have to be taken into account in the design of the loop filter or other measures that are employed to reduce jitter. This is easily compensated by the reduced power consumption of the present invention, and the ease of dealing with a reference clock of two-times reduced frequency.

The design of the sub-rate bang-bang phase detector 502, based on a frequency reduction by a factor two of the reference cock has been described to illustrate the principle by which the clock frequency may be further reduced. For example if a reference clock of one quarter the frequency of the data bit rate is desired, a 45° phase shifted clock, as well as a 90° phase shifted clock, are required in order to sample the data stream in pairs of consecutive bit positions including the intervening transition.

In this quarter-rate phase detector, only every fourth transition would be captured, and the frequency adjustment rate would also be reduced more, possibly increasing the jitter of a phase locked loop in which a quarter-rate bang-bang phase detector is employed. Again this may be more than compensated for, by the significantly reduced power consumption, and the ease of dealing with a reference clock of four time reduced frequency.

In general, a PLL with sub-rate clock and sub-rate bang-bang phase detector may be designed, based on the alternate arrangement 850 of FIG. 8B, as follows:

assuming a sub-rate factor of N is desired, that is the reference clock rate is 1/N of the data bit rate;

replace the multi-phase VCO 510 with a multi-phase VCO providing a reference clock CKa with a frequency of 1/N of the data bit rate, and two phase-shifted clocks CKb and CKc which are phase-shifted from CKa by 180/N degrees and 360/N degrees respectively;

couple the reference clock CKa and the phase-shifted clocks CKb and CKc in place of CK, CK 90, and CK180 in FIG. 8B.

In this general case, every Nth data stream transition is sampled with the phase-shifted clock CKb to yield the a logic signal $B_N$, while the data bits before and following each sampled transition are sampled with the reference clock CKa and the phase-shifted clock CKc to yield logic signals $A_N$ and $C_N$. The logic signals $A_N$, $B_N$, and $C_N$ are equivalent to the logic signals A', B', and C' of FIG. 8B, and may be used according to the bang-bang method for adjusting the frequency of the reference clock. While thus a high sub-rate factor may be achieved in principle, the application of a very high sub-rate factor may not be suitable in all applications. As a practical matter, sub-rate factors of N>8 may not be practical due to the increased jitter and false locking.

Figure 10:
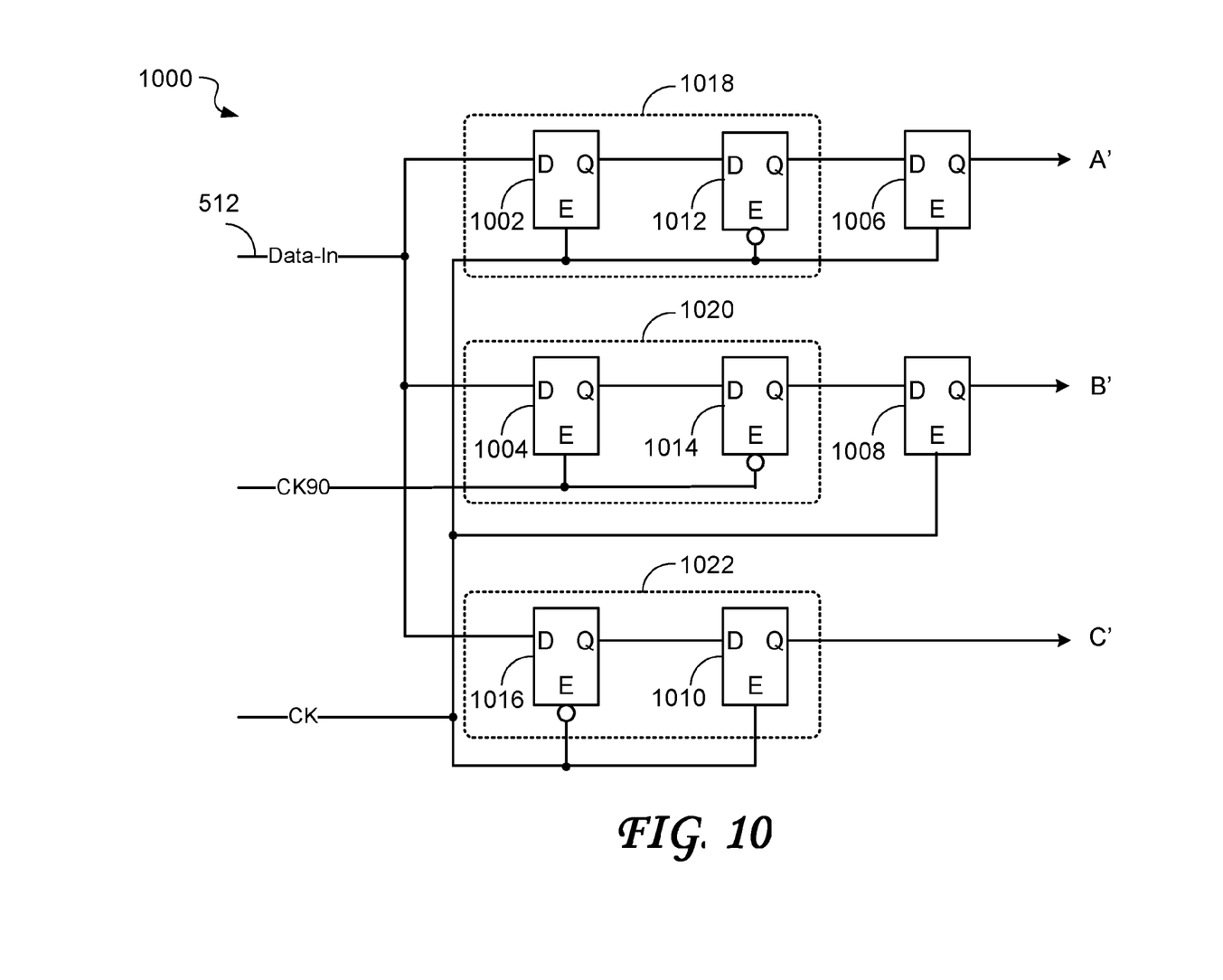
FIG. 10 shows a block diagram of a second implementation 1000 of the sub-rate bang-bang phase detector 502 of the PLL 500 of FIG. 5.

FIG. 10 shows block diagram of a second implementation 1000 of the sub-rate bang-bang phase detector 502 of the PLL 500 of FIG. 5. In the second implementation 1000 transparent latches ("latches") are used instead of D-type flip-flops, including five high latching latches 1002, 1004, 1006, 1008, and 1010, and three low latching latches 1012, 1014, and 1016. A transparent latch is a bit-storage device having a data input D, an enable input E, and a data output Q. In a transparent latch, the data output Q follows the input D while the enable input E is in one state, and latches and holds the value present at Q following a transition of the enable input E to the opposite state. Thus, in a high latching transparent latch, the output Q follows the input D while the enable input E is low, and latches the last data value when E goes high. Conversely, in a low latching transparent latch, the output Q follows the input D while the enable input E is high, and latches the last data value when E goes low. A combination 1018 of the high latching latch 1002 and the low latching latch 1012 where the data output Q of the high latching latch 1002 is coupled to the data input D of the low latching latch 1012, and where the enable inputs E of both are driven by the same signal, i.e. the reference clock CK, may be considered as a single bit-storage device that is functionally equivalent to a D type flip-flop. Similarly, a combination 1020 of the high latching latch 1004 and the low latching latch 1014 driven by the phase shifted clock CK90, and a combination 1022 of the low latching latch 1016 and the high latching latch 1010, driven by the reference clock CK, may each be considered as single bit-storage devices that are functionally equivalent to D type flip-flops.

The second implementation 1000 is the preferred implementation, because latches are generally preferred to flip-flops in very high speed circuit implementations. Both implementations 800 and 1000 have the same overall functionality, which was described in detail with respect to the implementation 800 in the timing diagram of FIG. 9.

In the second implementation 1000 of FIG. 10, the input data stream 512 (Data-In) is input to the data inputs D of the first and second high latching latches 1002 and 1004, and of the fifth low latching latch 1016. The phase shifted clock CK90 is input to the enable inputs E of the second high latching latch 1004 and of the second low latching latch 1014. The reference clock CK is input to the enable inputs E of the remaining transparent latches, that is the high latching latches 1002, 1006, 1008, and 1010, and the low latching latch 1016. The data outputs Q of the transparent latches 1002, 1004, 1012, 1014, and 1016 are connected to the D inputs of the transparent latches 1012, 1014, 1006, 1008, and 1010 respectively. The Q outputs of the transparent latches 1006, 1008, and 1010 provide the logic signals A', B, and C' respectively.

In the set of Figures FIG. 4a to 4f, the principle of a PLL based on a bang-bang phase detector has been described. In the PLL 500 (FIG. 5) of the present invention, this principle is maintained, that is the three logic signals from the sub-rate bang-bang phase detector 502 are evaluated in the Interpretation Logic 504 to produce the two charge pump control signals, i.e. the "adjust up" signal 514 and the "adjust down" signal 516.

Figure 11:
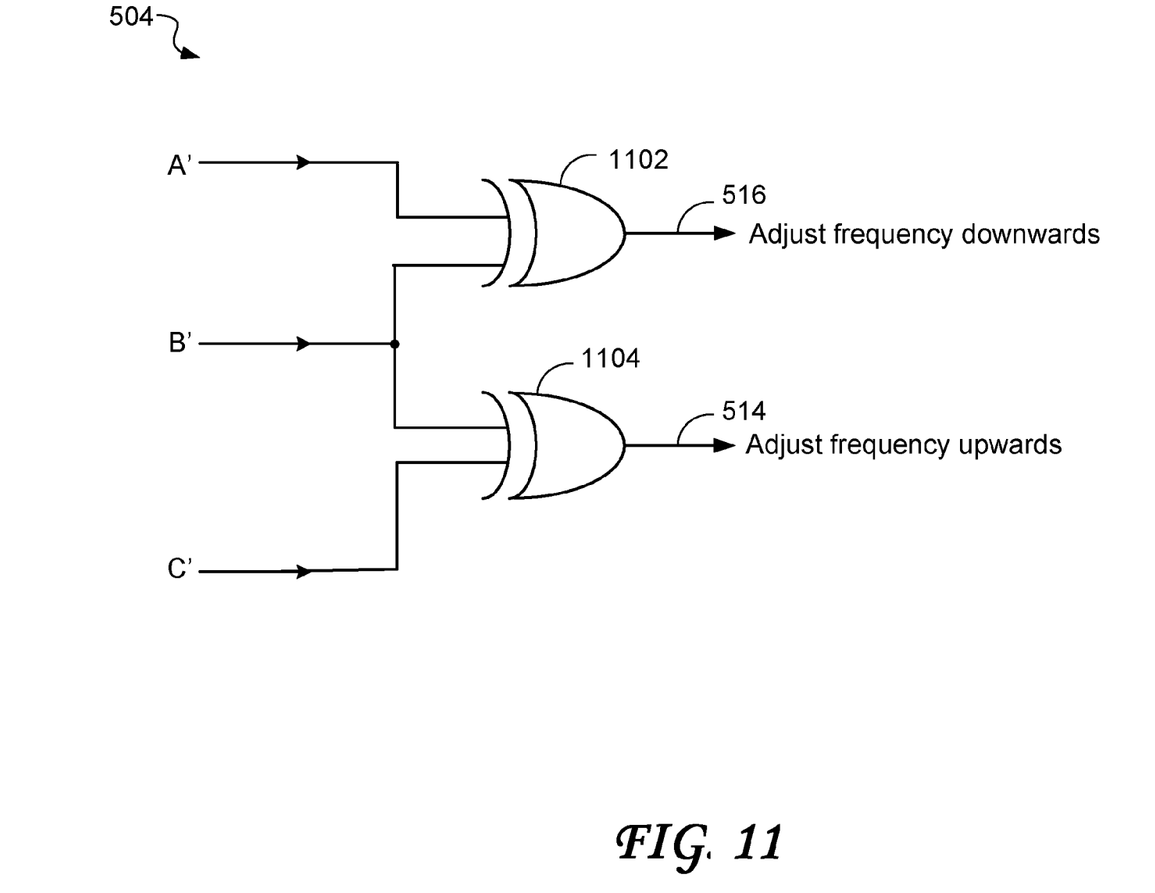
FIG. 11 shows an implementation of the Interpretation Logic 504 of the PLL 500 of FIG. 5.

FIG. 11 shows an implementation of the Interpretation Logic 504 of the PLL 500 of FIG. 5, including two exclusive-OR gates (XOR) 1102 and 1104. The logic signals A' and B' are coupled to the inputs of the first exclusive-OR gate 1102 whose output generates the "adjust down" signal 516. The logic signals C' and B' are coupled to the inputs of the second exclusive-OR gate 1104 whose output generates the "adjust up" signal 514.

The functionality of this circuit may thus be described by the following pair of logical expressions:

Adjust frequency downwards=A' XOR B' and

Adjust frequency upwards=B' XOR C'

A number of embodiments of the invention have been described and illustrated in FIGS. 8a, 8b, and FIG. 10. Modifications and variations of these may be readily derived from these embodiments, for example, substituting positive edge triggered for negative edge triggered flip flops and vice versa throughout in FIG. 8a or 8b will result in embodiments in which the falling edge of the phase shifted clock CK90 aligns with the transitions of the data stream. Similarly, mutual substitution of low latching and high latching transparent latches in FIG. 10 will also result in an embodiment in which the falling edge of the phase shifted clock CK90 aligns with the transitions of the data stream. Furthermore, other combinations of bit-storage devices (flip-flops and transparent latches as in FIG. 8a or 8b and FIG. 10 respectively) may be selected as may be convenient to implement a sub-rate phase detector.

Although embodiments of the invention have been described in detail, it will be apparent to one skilled in the art that variations and modifications to the embodiment may be made within the scope of the following claims.

What is claimed is:

1. A phase detector for generating logic signals indicative of phase transitions of an input data stream with respect to a reference clock signal, the phase detector comprising:
    a first bit-storage device for sampling the input data stream with the reference clock signal;
    a second bit-storage device for sampling the input data stream with a first phase shifted clock signal whose phase is delayed by X degrees relative to the reference clock signal;
    a third bit-storage device for sampling the input data stream with a second phase shifted clock signal whose phase is delayed by Y degrees relative to the reference clock signal, to generate a logic signal "C"; and
    fourth and fifth bit-storage devices for sampling outputs of the first and second bit-storage devices respectively to generate logic signals "A" and "B" respectively;
    wherein the first, second, and third bit-storage devices respectively comprise first, second, and third combinations of first and second transparent latches, wherein an output of the first transparent latch is coupled to an input of the second transparent latch in each of the respective combinations; and
    wherein the first transparent latch is a high or low latching transparent latch, and the second transparent latch is a respective low or high latching transparent latch.

2. The phase detector of claim 1, wherein:
    the first bit-storage device is a first edge triggered bit-storage device responsive to one of a rising or falling edge of the reference clock signal;
    the second bit-storage device is a second edge triggered bit-storage device responsive to a respective rising or falling edge of the first phase shifted clock signal;

the third bit-storage device is a third edge triggered bit-storage device responsive to a respective rising or falling edge of the second phase shifted clock signal; and the fourth and fifth edge triggered bit-storage devices are fourth and fifth edge triggered bit-storage devices, each responsive to the respective rising or falling edge of the reference clock signal.

3. The phase detector of claim 2, wherein the third edge triggered bit-storage device is responsive to a respective falling or rising edge of the reference clock signal instead of the second phase shifted clock signal.

4. The phase detector of claim 3, wherein the first, second, third, fourth and fifth edge triggered bit-storage devices comprise respective edge triggered flip-flops.

5. The phase detector of claim 1, wherein the fourth and fifth bit-storage devices comprise respective high or low latching transparent latches.

6. The phase detector of claim 1, wherein X=90 degrees.

7. The phase detector of claim 1, wherein Y=180 degrees.

8. The phase detector of claim 1, wherein X=180/N degrees and Y=360/N degrees, and N is a sub-rate factor by which a frequency of the reference clock is lower than a bit rate of the input data stream.

9. A phase locked loop (PLL), comprising the phase detector of claim 1, the PLL further comprising a multiphase voltage controlled oscillator (VCO) for generating the reference clock signal and the first and second phase shifted clock signals.

10. The PLL of claim 9, further including a logic circuit for deriving frequency adjustment signals from the logic signals "A", "B", and "C" for adjusting a frequency of the reference clock.

11. A method of generating logic signals indicative of phase transitions of an input data stream with respect to a reference clock signal, the method comprising:

sampling the input data stream with a reference clock signal, including storing results of the sampling in a first bit-storage device;

sampling the input data stream with a first phase shifted clock signal whose phase is delayed by X degrees relative to the reference clock signal, including storing results of the sampling in a second bit-storage device;

sampling the input data stream with a second phase shifted clock signal whose phase is delayed by Y degrees relative to the reference clock signal to generate the logic signal "C", including storing results of the sampling in a third bit-storage device; and sampling outputs of the first and second bit-storage devices respectively to generate respective logic signals "A" and "B", including storing results of the sampling in fourth and fifth bit-storage devices;

wherein sampling and storing in the first bit-storage device includes latching in a first transparent latch and storing an output of the first transparent latch in a second transparent latch; and wherein latching with the first transparent latch includes latching with a rising or falling edge of the reference clock signal, and storing in the second transparent latch includes latching with a respective opposite edge of the reference clock signal.

12. The method of claim 11, wherein:

sampling and storing in the first bit-storage device comprises sampling with a rising or falling edge of the reference clock signal;

sampling and storing in the second bit-storage device comprises sampling with a respective rising or falling edge of the first phase shifted clock signal;

sampling and storing in the third bit-storage device comprises sampling with a respective rising or falling edge of the second phase shifted clock signal; and sampling and storing in the fourth and fifth bit-storage devices comprises sampling with a respective rising or falling edge of the reference clock signal.

13. The method of claim 12, wherein sampling and storing in the third bit-storage device comprises sampling with a respective falling or rising edge of the reference clock signal instead of the second phase shifted clock signal.

14. The method of claim 12, wherein sampling and storing in the fourth and fifth bit-storage devices comprises latching in respective transparent latches.

15. The method of claim 11, wherein X=90 degrees and Y=180 degrees.

16. The method of claim 11, wherein X=180/N degrees and Y=360/N degrees, and N is a sub-rate factor by which a frequency of the reference clock is lower than a bit rate of the input data stream.

17. A method of generating a reference clock signal in a phase locked loop (PLL), comprising:

generating logic signals "A", "B" and "C" as described in claim 11;

generating the reference clock signal and the first and second phase shifted clock signals in a multiphase voltage controlled oscillator (VCO); and deriving frequency adjustment signals from the logic signals "A", "B", and "C" for adjusting a frequency of the reference clock.

* * * * *